(12) United States Patent
Pang et al.

(10) Patent No.: US 12,740,031 B2
(45) Date of Patent: Sep. 15, 2026

(54) DISPLAY APPARATUS AND DISPLAY PANEL

(71) Applicants: Chengdu BOE Optoelectronics Technology Co., Ltd., Chengdu (CN); BOE Technology Group Co., Ltd., Beijing (CN)

(72) Inventors: Mengyuan Pang, Beijing (CN); Chuandong Liao, Beijing (CN); Yaming Wang, Beijing (CN); Jiafan Shi, Beijing (CN); Shuquan Yang, Beijing (CN); Junshan Li, Beijing (CN); Wenliang Liu, Beijing (CN); Chao Yang, Beijing (CN); Yang Yang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 240 days.

(21) Appl. No.: 18/578,015

(22) PCT Filed: Jan. 6, 2023

(86) PCT No.: PCT/CN2023/070809

§ 371 (c)(1),
(2) Date: Jan. 10, 2024

(87) PCT Pub. No.: WO2023/142958

PCT Pub. Date: Aug. 3, 2023

(65) Prior Publication Data

US 2024/0224479 A1 Jul. 4, 2024

(30) Foreign Application Priority Data

Jan. 30, 2022 (CN) ........................ 202210113961.8

(51) Int. Cl.
*H05K 7/20* (2006.01)

(52) U.S. Cl.
CPC ................................ *H05K 7/20963* (2013.01)

(58) Field of Classification Search
CPC ................................................. H05K 7/20963
See application file for complete search history.

(56) References Cited

U.S. PATENT DOCUMENTS 11,029,546 B2 6/2021 Wang et al.
11,137,635 B2 10/2021 Higano et al.
(Continued)

FOREIGN PATENT DOCUMENTS

CN 109375408 A 2/2019
CN 110444665 A 11/2019
(Continued)

OTHER PUBLICATIONS

International Search Report and Written Opinion mailed on Apr. 3, 2023, in corresponding PCT/CN2023/070809, 9 pages.
(Continued)

*Primary Examiner* — Mukundbhai G Patel
(74) *Attorney, Agent, or Firm* — XSENSUS LLP

(57) ABSTRACT

A display panel comprises: a display substrate, having a display area, a non-display area, and a bendable area located therebetween; a back film, located on a side away from a light exit surface of the display substrate, where the back film comprises a first support area and a second support area, a projection of the first support area on the display substrate at least overlaps with the display area, and a projection of the second support area on the display substrate is located within the non-display area; and a heat dissipation film, located on a side of the back film away from the display substrate, where an orthographic projection of the heat dissipation film on the back film is located within the first
(Continued)

support area, a surface of the heat dissipation film away from the display substrate is provided with a groove, and the groove is filled with an adhesive.

18 Claims, 4 Drawing Sheets

(56) References Cited

U.S. PATENT DOCUMENTS

| | | | | |
|---|---|---|---|---|
| 2007/0069212 | A1 | 3/2007 | Saitoh et al. | |
| 2020/0050055 | A1 | 2/2020 | Higano et al. | |
| 2021/0027039 | A1* | 1/2021 | Yi | G06V 10/147 |
| 2021/0050534 | A1 | 2/2021 | Yang et al. | |
| 2021/0124197 | A1 | 4/2021 | Wang et al. | |
| 2023/0354565 | A1* | 11/2023 | Yin | H05K 7/20963 |

FOREIGN PATENT DOCUMENTS

| | | | |
|---|---|---|---|
| CN | 111128020 | A | 5/2020 |
| CN | 111798746 | A | 10/2020 |
| CN | 112289185 | A | 1/2021 |
| CN | 112530295 | A | 3/2021 |
| CN | 112820199 | A | 5/2021 |
| CN | 113066361 | A | 7/2021 |
| CN | 113066365 | A | 7/2021 |
| CN | 113629124 | A | 11/2021 |
| CN | 113707018 | A | 11/2021 |
| CN | 216980028 | U | 7/2022 |
| JP | 2020-027190 | A | 2/2020 |
| KR | 20210035148 | A | 3/2021 |
| WO | 2021017478 | A1 | 2/2021 |

OTHER PUBLICATIONS

Office Action issued Nov. 20, 2025 in Chinese Patent Application No. 202210113961.8, 19 pages.

* cited by examiner

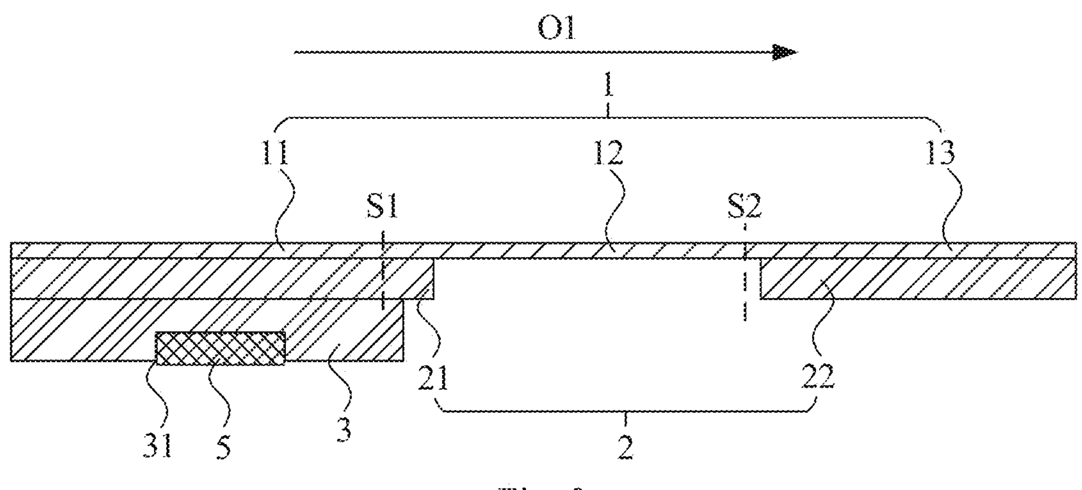
Fig. 3
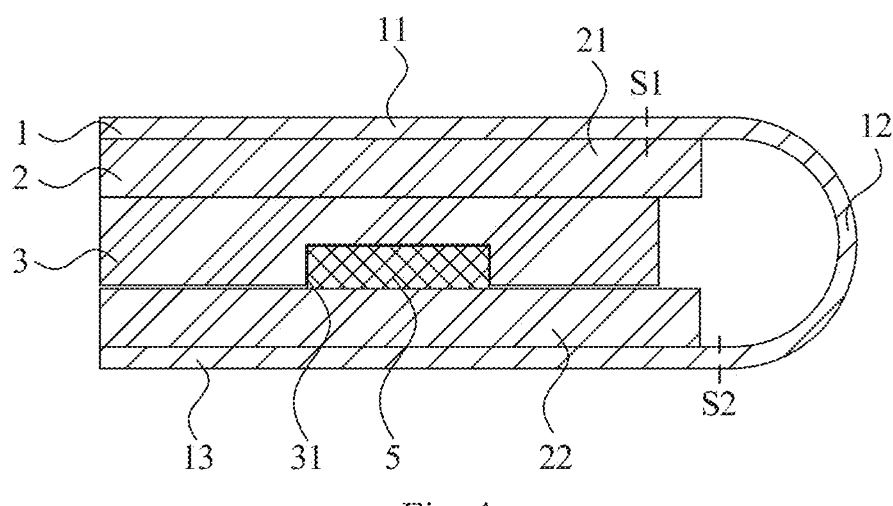
Fig. 4
Fig. 5

DISPLAY APPARATUS AND DISPLAY PANEL

CROSS REFERENCE TO RELATED APPLICATION(S)

The present disclosure is a 35 U.S.C. 371 national phase application of PCT International Application No. PCT/CN2023/070809 filed on Jan. 6, 2023, which claims priority to the Chinese patent application titled "Display Apparatus and Display Panel" with the application number No. 202210113961.8 filed on Jan. 30, 2022, the entire contents of both are incorporated herein by reference.

TECHNICAL FIELD

The present disclosure relates to the field of display technology, and specifically, to a display apparatus and a display panel.

BACKGROUND

At present, in order to realize a narrow frame or an extremely narrow frame of a display panel, a flexible display substrate is usually provided in the display panel. With the bendable characteristics of the flexible display substrate, the end of the flexible display substrate used for connecting to external circuits are folded towards the back side of the flexible display substrate, thereby reducing the encapsulation size of the flexible display substrate, and reducing the frame size of the display panel. However, the present inventor(s) has found that when the end of the flexible display substrate is bent to the back side of the flexible display substrate, the extremely narrow frame of the display panel cannot be achieved.

It should be noted that the information described in the Background section is only used to enhance understanding of the background of the present disclosure, and therefore may include information that does not constitute prior art known to those of ordinary skills in the art.

SUMMARY

An object of the present disclosure is to provide a display apparatus and a display panel that can realize an extremely narrow frame of the display panel.

According to a first aspect of the present disclosure, a display panel is provided, including:

- a display substrate, having a display area, a non-display area, and a bendable area located between the display area and the non-display area;
- a back film, located on the side away from the light exit surface of the display substrate, where the back film includes a first support area and a second support area, the projection of the first support area on the display substrate at least overlaps with the display area, and the projection of the second support area on the display substrate is located within the non-display area; and
- a heat dissipation film, located on the side of the back film away from the display substrate, where the orthographic projection of the heat dissipation film on the back film is located within the first support area, and the surface of the heat dissipation film away from the display substrate is provided with a groove, and the groove is filled with an adhesive.

After the bendable area is bent, the non-display area and the second support area are located on the side of the heat dissipation film away from the first support area, and the second support area covers the groove and is in contact with the adhesive.

According to the display panel in any embodiment of the present disclosure, the heat dissipation film includes an adhesive layer, a thermally conductive layer, and a conductive layer sequentially stacked in a direction away from the display substrate, and the groove penetrates the conductive layer.

According to the display panel in any embodiment of the present disclosure, the groove further penetrates the thermally conductive layer, and the adhesive layer extends into the groove to form the adhesive.

According to the display panel according to any embodiment of the present disclosure, the groove wall of the groove is provided with a step surface facing the display substrate.

According to the display panel according to any embodiment of the present disclosure, the heat dissipation film includes an adhesive layer, a thermally conductive layer, and a conductive layer, and the depth of the groove is greater than the thickness of the conductive layer.

The area of the first region corresponding to the groove on the surface of the thermally conductive layer facing the conductive layer is larger than the area of the second region corresponding to the groove on the surface of the conductive layer facing the thermally conductive layer.

According to the display panel according to any embodiment of the present disclosure, the groove is gradually shrinked in a direction approaching the display substrate.

According to the display panel in any embodiment of the present disclosure, the difference between the thickness of the adhesive and the depth of the groove is less than or equal to 0.02 mm.

According to the display panel in any embodiment of the present disclosure, a surface of the heat dissipation film away from the display substrate is provided with a plurality of grooves distributed in an array, and each groove is filled with the adhesive.

According to the display panel in any embodiment of the present disclosure, in the arrangement direction of the display area, the bendable area, and the non-display area, the distance between the groove at the outermost position and the respective edge on the heat dissipation film is greater than or equal to 0.3 mm.

In the direction perpendicular to the arrangement direction of the display area, the bendable area, and the non-display area, the distance between the groove at the outermost position and the respective edge on the heat dissipation film is greater than or equal to 3.5 mm.

According to a second aspect of the present disclosure, a method for manufacturing a display panel is provided, including:

- forming a display substrate having a display area, a non-display area, and a bendable area located between the display area and the non-display area;
- forming a back film on the side away from the light exit surface of the display substrate, where the back film includes a first support area and a second support area, the projection of the first support area on the display substrate at least overlaps with the display area, and the projection of the second support area on the display substrate is located within the non-display area;
- forming a heat dissipation film on the side of the first support area away from the display substrate, where the orthographic projection of the heat dissipation film on the back film is located within the first support area, the surface of the heat dissipation film away from the display substrate is provided with a groove, and the groove is filled with an adhesive that is at least flush with the surface of the heat dissipation film; and bending the bendable area of the display substrate, so that the non-display area and the second support area are bent to the side of the heat dissipation film away from the display area, and the second support area is adhered onto the adhesive.

According to the method in any embodiment of the present disclosure, the heat dissipation film includes an adhesive layer, a thermally conductive layer, and a conductive layer, and the forming the heat dissipation film on the side of the back film away from the display substrate includes:

forming the conductive layer with a first through hole and the thermally conductive layer with a second through hole;

supporting the conductive layer on the operation table, so that a gap with a first distance is reserved between the conductive layer and the table top of the operation table, where the first distance is less than or equal to 0.02 mm;

stacking the thermally conductive layer on the conductive layer, so that the second through hole is directly facing the first through hole to form the groove;

forming the adhesive layer on the side of the thermally conductive layer away from the conductive layer to acquire the heat dissipation film, where the adhesive layer extends to the first through hole and the second through hole; and peeling off the heat dissipation film from the table top of the operation table, and adhering the surface of the adhesive layer away from the thermally conductive layer to the side of the first support area away from the display substrate.

According to a third aspect of the present disclosure, a display apparatus is provided, including the display panel described in the first aspect.

It should be understood that the foregoing general description and the following detailed description are exemplary and explanatory only, and do not limit the present disclosure.

BRIEF DESCRIPTION OF THE DRAWINGS

The accompanying drawings, which are incorporated in and constitute a part of this specification, illustrate embodiments consistent with the present disclosure and together with the description, serve to explain the principle of the present disclosure. It is noted that the drawings in the following description are only some embodiments of the present disclosure. For those of ordinary skills in the art, other drawings can be obtained based on these drawings without exerting creative efforts.

FIG. 3 is a schematic structural diagram of a display panel provided by an embodiment of the present disclosure.

FIG. 4 is a schematic structural diagram of the display panel shown in FIG. 3 after being bent.

FIG. 5 is a schematic structural diagram of the display panel after being bent according to another embodiment of the present disclosure.

REFERENCE NUMERALS

Figure 1:
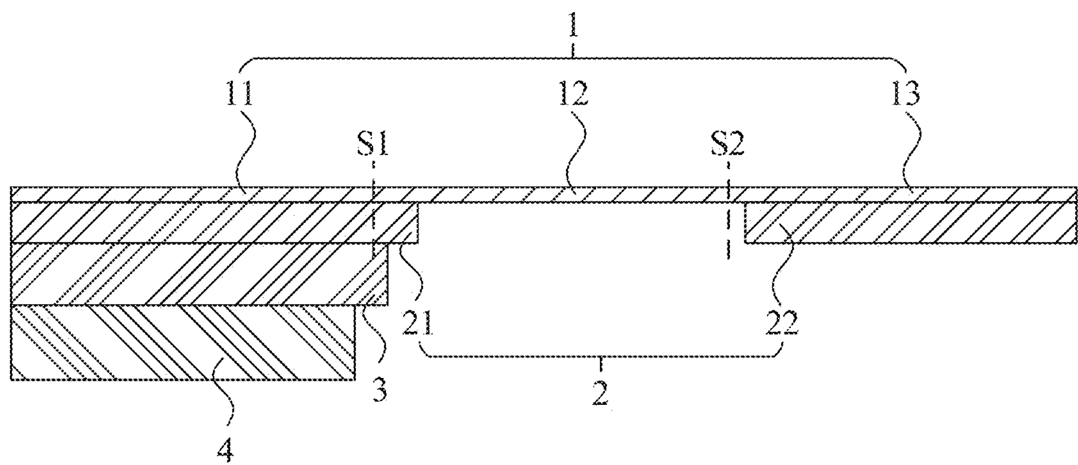
FIG. 1 is a schematic structural diagram of a display panel provided by the related art.

1. display substrate; 2. back film; 3. heat dissipation film; 4. spacer layer; 5. adhesive; 6. flexible protective layer; 11. display area; 12. bendable area; 13. non-display area; 21. first support area; 22. second support area; 31. groove; 311. step surface; 32. adhesive layer; 33. thermally conductive layer; 34. conductive layer.

DETAILED DESCRIPTION OF THE EMBODIMENTS

Example embodiments will now be described more fully with reference to the accompanying drawings. Example embodiments may, however, be embodied in various forms, and should not be construed as limited to the embodiments set forth herein. Rather, these embodiments are provided so that the present disclosure will be thorough and complete, and will fully convey the concept of the example embodiments to those skilled in the art. The same reference numerals in the drawings indicate the same or similar structures, and thus their detailed descriptions will be omitted. Furthermore, the drawings are merely schematic illustrations of the present disclosure, and are not necessarily drawn to scale.

The terms "a", "an", "the", "said", and "at least one" are used to indicate the presence of one or more elements or components, etc. The terms "include" and "have" are used to indicate an open-ended inclusion, and mean that there may be additional elements or components, etc. in addition to those listed. The terms "first", "second", "third" etc. are only used as markers, not to present any limitation on the number of the relevant objects.

In the related art, in order to achieve a narrow frame or an extremely narrow frame of a display panel and at the same time ensure the connection between the end of the display substrate 1 in the display panel and the external circuit, the encapsulation process of the display substrate 1 includes Chip on Flex or Chip on Film (COF), Chip on Glass (COG), Chip on Plastic (COP), the COP encapsulation process can significantly reduce the frame of the display panel compared to the COF encapsulation process and the COG encapsulation process. However, the present inventor(s) have found that when the display substrate 1 is encapsulation using the above COP encapsulation process, the total thickness of the film layers on the back side of the display substrate 1 is thicker, thereby resulting in a larger bending radius when the display substrate 1 is bending. Thus, after the display panel was manufactured, the extremely narrow frame of the display panel was not achieved.

Figure 2:
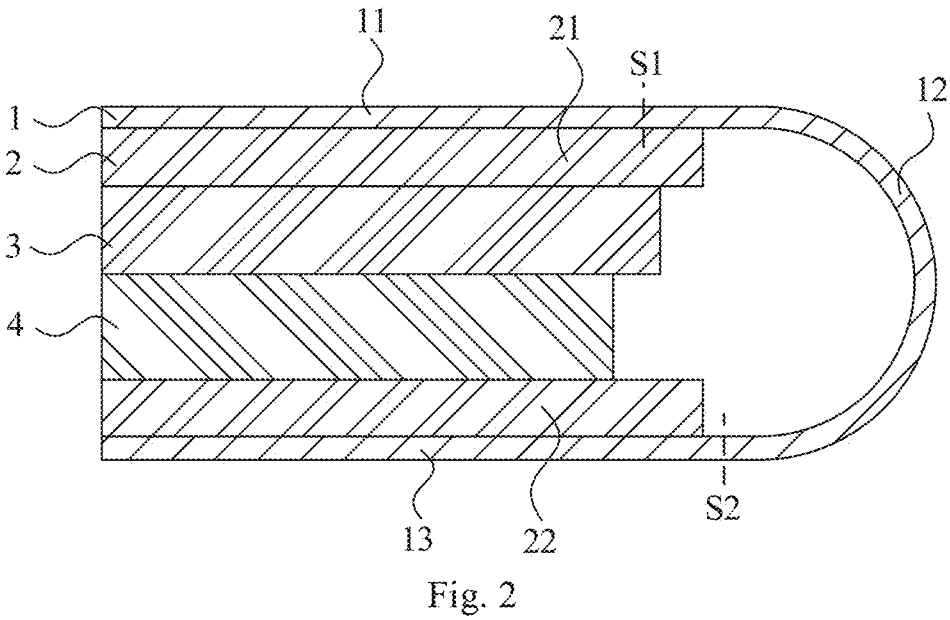
FIG. 2 is a schematic structural diagram of the display panel shown in FIG. 1 after being bent.

For example, a display panel in the related art is shown in FIG. 1, including a display substrate 1, a back film 2, a heat dissipation film 3, and a spacer layer. The back film 2 is located on the side away from the light exit surface of the display substrate 1. The heat dissipation film 3 is located on the side of the back film 2 away from the display substrate 1. The spacer layer is located on the side of the heat dissipation film 3 away from the display substrate 1. As shown in FIG. 2, when the display substrate 1 is encapsulated, the display substrate 1 is directly bent to achieve a narrow frame of the display panel. After the display substrate 1 is bent, the vertical distance between the display area 11 on the front and the non-display area 13 on the back of the display substrate 1 is the total thickness of the heat dissipation film 3, the thickness of the spacer layer, and the thickness of the two back films 2. As the vertical distance between the display area 11 and the non-display area 13 is relatively large, the bending radius of the display substrate 1 would be large when bending, thereby rendering that the lower frame of the display panel cannot be extremely narrowed.

FIG. 3 illustrates a schematic structural diagram of a display panel according to an embodiment of the present disclosure. As shown in FIG. 3, the display panel includes a display substrate 1, a back film 2, and a heat dissipation film 3. The display substrate 1 has a display area 11, a non-display area 13, and a bendable area 12 located between the display area 11 and the non-display area 13. The back film 2 is located on the side away from the light exit surface of the display substrate 1. The back film 2 includes a first support area 21 and a second support area 22. The projection of the first support area 21 on the display substrate 1 at least overlaps with the display area 11. The projection of the second support area 22 on the display substrate 1 is located within the non-display area 13. The heat dissipation film 3 is located on the side of the back film 2 away from the display substrate 1, and the orthographic projection of the heat dissipation film 3 on the back film 2 is located within the first support area 21. The surface of the heat dissipation film 3 away from the display substrate 1 is provided with a groove 31, and the groove 31 is filled with an adhesive 5. As shown in FIG. 4, after the bendable area 12 is bent, the non-display area 13 and the second support area 22 are located on the side of the heat dissipation film 3 away from the first support area 21, and the second support area 22 covers the groove 31 and is in contact with the adhesive 5.

According to the display panel in the related art, after the display substrate 1 is bent, the vertical distance between the display area 11 and the non-display area 13 of the display substrate 1 is the total thickness of the heat dissipation film 3, the thickness of the spacer layer 4, and the two back films 2. According to the display panel in the embodiments of the present disclosure, after the display substrate 1 is bent, the vertical distance between the display area 11 and the non-display area 13 of the display substrate 1 is only the total thickness of the heat dissipation film 3 and the two back films 2. Thus, the vertical distance between the display area 11 and the non-display area 13 is reduced. That is, the bending radius is reduced of the bendable area 12 of the display substrate 1 when bending, thereby accomplishing the purpose of reducing the frame width of the display panel.

For example, in the related art, the vertical distance between the display area 11 and the non-display area 13 of the display substrate 1 is approximately 0.6 mm. In an embodiment of the present disclosure, the vertical distance between the display area 11 and the non-display area 13 of the display substrate 1 is greater than or equal to 0.19 mm and less than or equal to 0.24 mm. It can be seen that in the display substrate 1 according to an embodiment of the present disclosure, the bending radius of the display substrate 1 when bending can be significantly reduced, so that the purpose of acquiring an extremely narrow frame can be achieved for the display panel. For example, in an embodiment of the present disclosure, the vertical distance between the display area 11 and the non-display area 13 of the display substrate 1 is 0.2 mm. That is, the thickness of the heat dissipation film 3 and the thicknesses of the two back films 2 add up to be 0.2 mm. At this time, the bending radius of the display substrate 1 when bending is only 0.1 mm.

As shown in FIG. 3 or FIG. 4, the area on the display substrate 1 located at the side of the division line S1 away from the division line S2 is the display area 11, the area located between the division line S1 and the division line S2 is the bendable area 12, and the area located at the side of the division line S2 away from the division line S1 is the non-display area 13. The display area 11, the bendable area 12, and the non-display area 13 of the display substrate 1 are an integrated structure. The layer structures included in the display substrate 1 can refer to the related technology, and will not be described in detail in the embodiments of the present disclosure. The display area 11, non-display area 13, and the bendable area 12 of the display substrate 1 are all made of flexible materials to facilitate the bending of the display substrate 1. It is noted that the display area 11 and the non-display area 13 of the display substrate 1 may also be made of rigid materials, and the bendable area 12 of the display substrate 1 is made of flexible materials, as long as the bendable area 12 of the display substrate 1 can be ensured to be bendable. The embodiments of the present disclosure are not limited in this regard.

In some embodiments, the division line S1 may be flush with the edge of the first support area 21 in FIG. 3 or 4, and the division line S2 may be flush with the edge of the second support area 22.

With regard to the bendable area 12 of the display substrate 1, in order to avoid the breakage of the internal circuits when the bendable area 12 is bent, as shown in FIG. 5, the display panel also includes a flexible protective layer 6. The flexible protective layer 6 is located at a side position with respect to the light exit surface of the display substrate 1, and the projection of the flexible protective layer 6 on the display substrate 1 is located in the bendable area 12. For example, the flexible protective layer 6 is a UV glue layer. In order to prevent the flexible protective layer 6 from increasing the frame width of the display panel, the thickness of the flexible protective layer 6 may be set to be greater than or equal to 50 microns and less than or equal to 70 microns.

With regard to the layer structures included in the back film 2, references may be made to the related technologies, and the embodiments of the present disclosure are not limited thereto. In order to ensure that the display area 11 of the display substrate 1 can display images normally and avoid bending and deformation at the edge of the display area 11 that affects the image quality, the orthographic projection of the first support area 21 on the display substrate 1 is arranged to overlap with the display area 11 or cover the display area 11. That is, the edge of the first support area 21 close to the second support area 22 is aligned with the edge of the display area 11 close to the bendable area 12, or exceeds the edge of the display area 11 close to the bendable area 12. In addition, for the case where the orthographic projection of the second support area 22 on the display substrate 1 is located within the non-display area 13, when the bendable portion in the bendable area 12 is not enough to bend the second support area 22 and the non-display area 13 to the back side of the heat dissipation film 3, part of the non-display area 13 can be used to assist the bending of the bendable area 12, thereby ensuring the encapsulation of the display substrate 1.

In an embodiment of the present disclosure, the material of the adhesive 5 in the groove 31 may be selected according to the adhering performance of the material itself, as long as the stable adhering between the heat dissipation film 3 and the second support area 22 of the back film 2 is ensured. For example, the adhering performance of the adhesive 5 is greater than or equal to 2000 gf/in.

When the adhesive 5 is filled in the groove 31, the adhesive 5 may be flush with the surface of the heat dissipation film 3, or may be also slightly protruding from the surface of the heat dissipation film 3. When the adhesive 5 protrudes from the surface of the heat dissipation film 3, and the second support area 22 of the back film 2 comes into contact with the adhesive 5, the adhesive 5 can be squeezed to increase the contact area between the second support area 22 and the adhesive 5, thereby improving the adhering effect between the second support area 22 and the adhesive 5.

In order to prevent the adhesive 5 from protruding too high from the surface of the heat dissipation film 3 and causing an air gap between the non-display area 13 of the display substrate 1 and the conductive layer 34, the difference between the thickness of the adhesive 5 and the depth of the groove 31 is selected to be less than or equal to 0.02 mm. For example, the difference between the thickness of the adhesive 5 and the depth of the groove 31 may be 0.01 mm. That is, the height of the adhesive 5 protruding from the surface of the heat dissipation film 3 is 0.01 mm.

In addition, when the adhesive 5 is filled in the groove 31, in order to prevent the adhesive 5 from protruding out from the groove 31, in some embodiments, the groove 31 is arranged to be gradually shrinked in the direction approaching the display substrate 1. That is, the area of the region corresponding to the groove 31 on a plane parallel to the display substrate 1 is gradually decreased in a direction approaching the display substrate 1. In this way, the adhering area between the adhesive 5 and the heat dissipation film 3 can be increased, thereby improving the adhering stability of the adhesive 5 in the groove 31. By way of example, the groove 31 is a conical groove or a pyramid groove.

Since the area of the region corresponding to the groove 31 on the plane parallel to the display substrate 1 is gradually increased in the direction away from the display substrate 1, the contact area between the second support area 22 of the back film 2 and the adhesive 5 can be increased, thereby ensuring the adhering effect to the second support area 22 of the back film 2.

In other embodiments, the groove wall of the groove 31 is provided with a step surface 311 facing the display substrate 1. In this way, the adhesive 5 filled in the groove 31 can form a limit at the step surface 311, thereby preventing the adhesive 5 from protruding out from the groove 31 and ensuring the adhering stability between the adhesive 5 and the heat dissipation film 3.

The position of the step surface 311 may be determined in combination with the depth of the groove 31 and the structural layers included in the heat dissipation film 3, which will be explained in detail when explaining the heat dissipation film 3 below.

In an embodiment of the present disclosure, when the second support area 22 of the back film 2 is adhered to the side of the heat dissipation film 3 away from the display area 11 through the adhesive 5 in the groove 31, in order to ensure the adhering effect to the second support area 22, in some embodiments, the groove 31 is arranged to be a strip-shaped structure. In this way, through the strip-shaped groove 31, the contact area between the adhesive 5 in the groove 31 and the second support area 22 is increased, thereby ensuring the adhering effect to the second support area 22.

After the non-display area 13 of the display substrate 1 and the second support area 22 of the back film 2 are bent to the side of the heat dissipation film 3 away from the first support area 21, the second support area 22 covers the groove 31 of the strip-shaped structure. That is, the orthographic projection on the second support area 22 of the area surrounded by the groove 31 of the strip-shaped structure is located within the region where the second support area 22 is located. The grooves 31 may be distributed in the arrangement direction of the display area 11, the bendable area 12, and the non-display area 13 included in the display substrate 1, and extend in a direction perpendicular to the arrangement direction.

Figure 6:
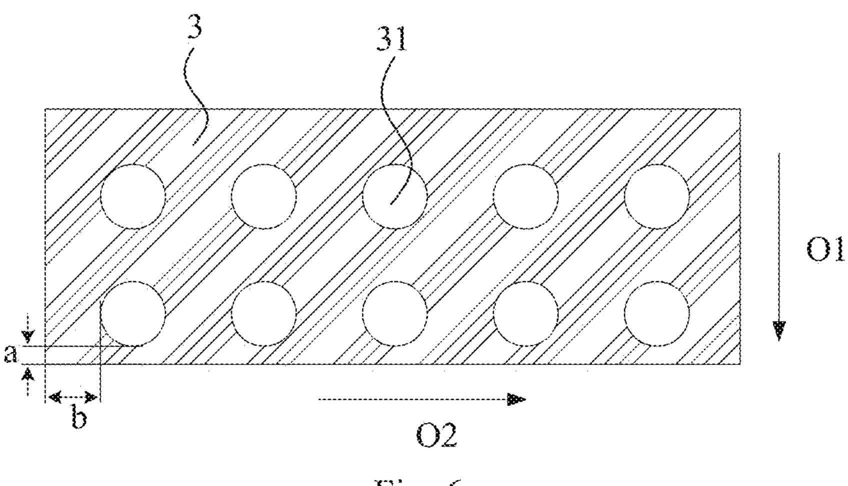
FIG. 6 is a schematic structural diagram in an upward view of a heat dissipation film provided by an embodiment of the present disclosure.

In other embodiments, as shown in FIG. 6, a plurality of grooves 31 may be provided on the surface of the heat dissipation film 3 away from the display substrate 1, and each of the plurality of grooves 31 is filled with the adhesive 5. In this way, the contact area with the second support area 22 of the back film 2 is increased through the adhesive 5 in the plurality of grooves 31, thereby ensuring the adhering effect to the second support area 22.

The plurality of grooves 31 are distributed in an array, which helps to ensure the hardness of the heat dissipation film 3, thereby ensuring the support effect of the display substrate 1 by the heat dissipation film 3, avoiding the heat dissipation path of the heat dissipation film 3 to become longer at the same time, and further ensuring the heat dissipation effect of the display substrate 1.

The cross-sectional shape of the groove 31 is circular, elliptical, rectangular, etc. After the non-display area 13 of the display substrate 1 and the second support area 22 of the back film 2 are bent to the side of the heat dissipation film 3 away from the display area 11 of the display substrate 1, the orthographic projection on the second support area 22 of the area surrounded by each groove 31 is located within the region where the second support area 22 is located.

As shown in FIG. 6, the plurality of grooves 31 is distributed in a matrix. The row direction O2 of the matrix includes a plurality of grooves 31, and the column direction O1 of the matrix includes at least one groove 31. As shown in FIG. 3 and FIG. 6, the row direction O1 of the matrix is perpendicular to the arrangement direction O1 of the display area 11, the bendable area 12, and the non-display area 13 included in the display substrate 1, and the column direction O1 of the matrix is the arrangement direction O1 of the display area 11, the bendable area 12, and the non-display area 13 of the display substrate 1.

For the above two modes, when the groove 31 is provided on the surface of the heat dissipation film 3 away from the display substrate 1, in the arrangement direction of the display area 11, the bendable area 12, and the non-display area 13, the distance between the groove 31 at the outermost position and the respective edge on the heat dissipation area is greater than or equal to 0.3 mm. For example, as shown in FIG. 6, in the column direction O1 of the plurality of grooves 31 arranged in an array, the distance a between the groove 31 at the outermost position and the respective edge on the heat dissipation film 3 is 0.4 mm. In the direction perpendicular to the arrangement direction of the display area 11, the bendable area 12, and the non-display area 13, the distance between the groove 31 at the outermost position and the respective edge on the heat dissipation film 3 is greater than or equal to 3.5 mm. For example, as shown in FIG. 6, in the row direction O2 of the plurality of grooves 31 arranged in an array, the distance b between the groove 31 at the outermost position and the respective edge on the heat dissipation film 3 is 4 mm.

Figure 7:
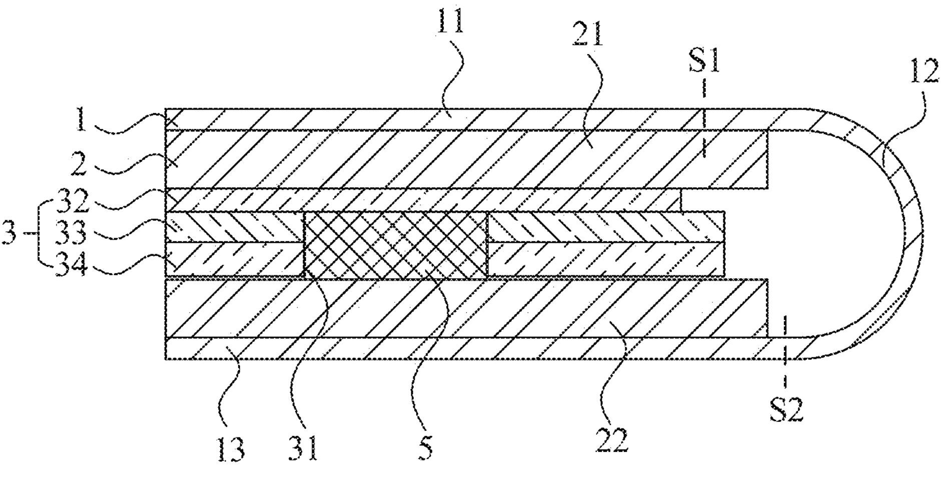
FIG. 7 is a schematic structural diagram of the display panel provided by another embodiment of the present disclosure.
Figure 8:
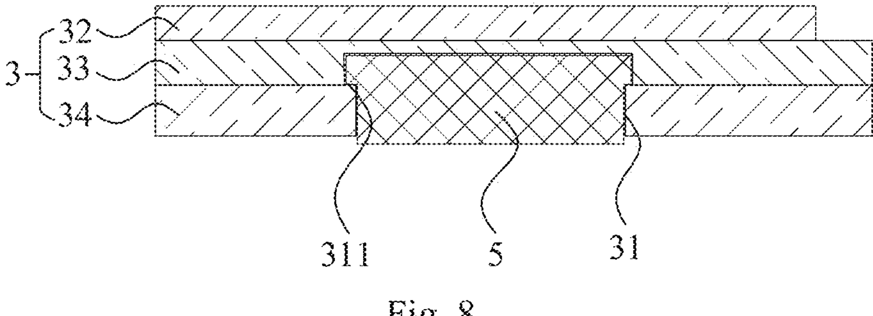
FIG. 8 is a schematic structural diagram in a front view of the heat dissipation film provided by an embodiment of the present disclosure.
Figure 9:
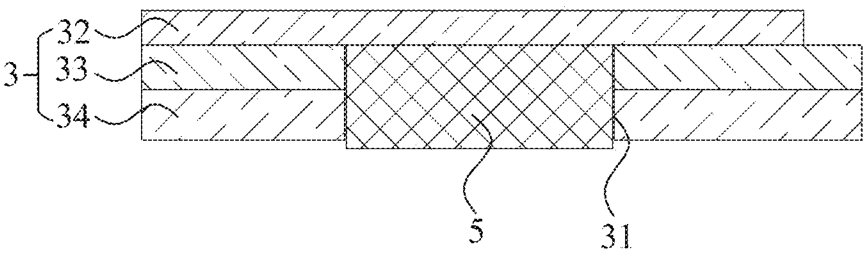
FIG. 9 is a schematic structural diagram in a front view of the heat dissipation film provided by another embodiment of the present disclosure.

In an embodiment of the present disclosure, the heat dissipation film 3 may play the role of light shading, buffering, heat dissipation, shielding, and support for the display substrate 1. As shown in FIG. 7, FIG. 8, or FIG. 9, the heat dissipation film 3 includes an adhesive layer 32, a thermally conductive layer 33, and a conductive layer 34 that are sequentially stacked in a direction away from the display substrate 1.

The adhesive layer 32 is used to fix the heat dissipation film 3 on the side of the back film 2 away from the display substrate 1, and also has a light shading effect. The material of the adhesive layer 32 may be grid glue or pressure-sensitive adhesive. It is noted that other materials with an adhering function may also be used, which is not limited in the embodiments of the present disclosure. When the material of the adhesive layer 32 is grid glue, the adhesive layer 32 also has the function of removing air bubbles.

The thermally conductive layer 33 is used to conduct heat from the display substrate 1 to the conductive layer 34. The thermally conductive layer 33 may be made of thermally conductive graphite or foam. When foam is used to prepare the thermally conductive layer 33, due to the adhesiveness of the foam, the adhesive layer 32 and the conductive layer 34 can be adhered and fixed, thereby avoiding the separation between the thermally conductive layer 33 and the conductive layer 34. In addition, apart from the role of thermal conduction, the foam also has the role of buffering and damping. When other non-adhesive materials such as thermally conductive graphite are used to prepare the thermally conductive layer 33, the adhesive 5 is required for adhering the thermally conductive layer 33 and the conductive layer 34, so as to avoid the separation between the thermally conductive layer 33 and the conductive layer 34.

The conductive layer 34 is used to achieve heat dissipation and electromagnetic shielding, and the conductive layer 34 may have a certain hardness to support the display substrate 1. For example, the conductive layer 34 is made of copper foil.

It should be noted that in an embodiment of the present disclosure, when manufacturing the display panel, the preparation of the heat dissipation film 3 can be completed first, and then the heat dissipation film 3 including the adhesive layer 32, the thermally conductive layer 33, and the conductive layer 34 is integrally adhered to the side of the back film 2 away from the display substrate 1. After the preparation of the heat dissipation film 3 is completed, the surface of the adhesive layer 32 away from the thermally conductive layer 33 has a release paper. It is noted that each structural layer included in the heat dissipation film 3 may also be adhered layer by layer to the side of the back film 2 away from the display substrate 1. For example, the adhesive layer 32, the thermally conductive layer 33, and the conductive layer 34 are provided layer by layer on the side of the back film 2 away from the display substrate 1.

In an embodiment of the present disclosure, as shown in FIG. 8 or FIG. 9, the surface of the heat dissipation film 3 away from the display substrate 1 is provided with a groove 31. In consideration of the layer structures of the heat dissipation film 3 described above, the depth of the groove 31 may be determined according to the thickness of the conductive layer 34 and the thickness of the thermally conductive layer 33, as long as it is ensured that the adhesive 5 filled in the groove 31 can be firmly adhered onto the heat dissipation film 3.

The groove 31 does not penetrate the conductive layer 34. That is, the depth of the groove 31 is less than the thickness of the conductive layer 34. Alternatively, the groove 31 only penetrates the conductive layer 34. That is, the depth of the groove 31 is equal to the thickness of the conductive layer 34. At this time, the area corresponding to the groove 31 on the surface of the thermally conductive layer 33 close to the conductive layer 34 serves as the groove bottom of the groove 31. Alternatively, as shown in FIG. 8, the groove 31 extends to the thermally conductive layer 33, but does not penetrate the thermally conductive layer 33. That is, the depth of the groove 31 is greater than the thickness of the conductive layer 34 and less than the total thickness of the conductive layer 34 and the thermally conductive layer 33. Alternatively, as shown in FIG. 9, the groove 31 not only penetrates the conductive layer 34, but also penetrates the thermally conductive layer 33. That is, the depth of the groove 31 is equal to the total thickness of the conductive layer 34 and the thermally conductive layer 33.

It should be noted that if the depth of the groove 31 is less than or equal to the thickness of the conductive layer 34, it may be provided on the conductive layer 34 in advance, or provided after the conductive layer 34 and the thermally conductive layer 33 are adhered. If the depth of the groove 31 is greater than the thickness of the conductive layer 34 and less than or equal to the total thickness of the conductive layer 34 and the thermally conductive layer 33, then it may be respectively provided on the conductive layer 34 and the thermally conductive layer 33 in advance, and aligned when the conductive layer 34 and the thermally conductive layer 33 are bonded.

In consideration of the above description, in order to prevent the adhesive 5 from protruding out from the groove 31, as shown in FIG. 9, if the groove 31 penetrates the conductive layer 34 and the thermally conductive layer 33, that is, the depth of the groove 31 is equal to the total thickness of the conductive layer 34 and the thermally conductive layer 33, then when preparing the adhesive layer 32 of the heat dissipation film 3, the adhesive layer 32 may be made to extend into the groove 31 to form the adhesive 5 integrated with the adhesive layer 32. As for the case where each structural layer of the heat dissipation film 3 is adhered layer by layer on the side away from the display substrate 1, since the material of the adhesive layer 32 has good fluidity, it is not easy to pre-form the adhesive 5 for filling in the groove 31 when preparing the adhesive layer 32. Thus, the adhesive 5 can only be filled in the groove 31 after the thermally conductive layer 33 and the conductive layer 34 are completely set.

As shown in FIG. 8, if the depth of the groove 31 is greater than the thickness of the conductive layer 34, then the area of the region corresponding to the groove 31 on the surface of the conductive layer 34 close to the thermally conductive layer 33 is larger than the area of the region corresponding to the groove 31 on the surface of the thermally conductive layer 33 close to the conductive layer 34. In this way, a step surface 311 facing the adhesive layer 32 can be formed in the groove 31, thereby limiting the adhesive 5 in the groove 31 through the step surface 311, and ensuring the adhering strength between the adhesive 5 and the heat dissipation film 3. It is noted that the step surface 311 may also be formed on the conductive layer 34 corresponding to the groove wall of the groove 31, or the step surface 311 may be formed on the thermally conductive layer 33 corresponding to the groove wall of the groove 31. The embodiments of the present disclosure are not limited thereto.

Figure 10:
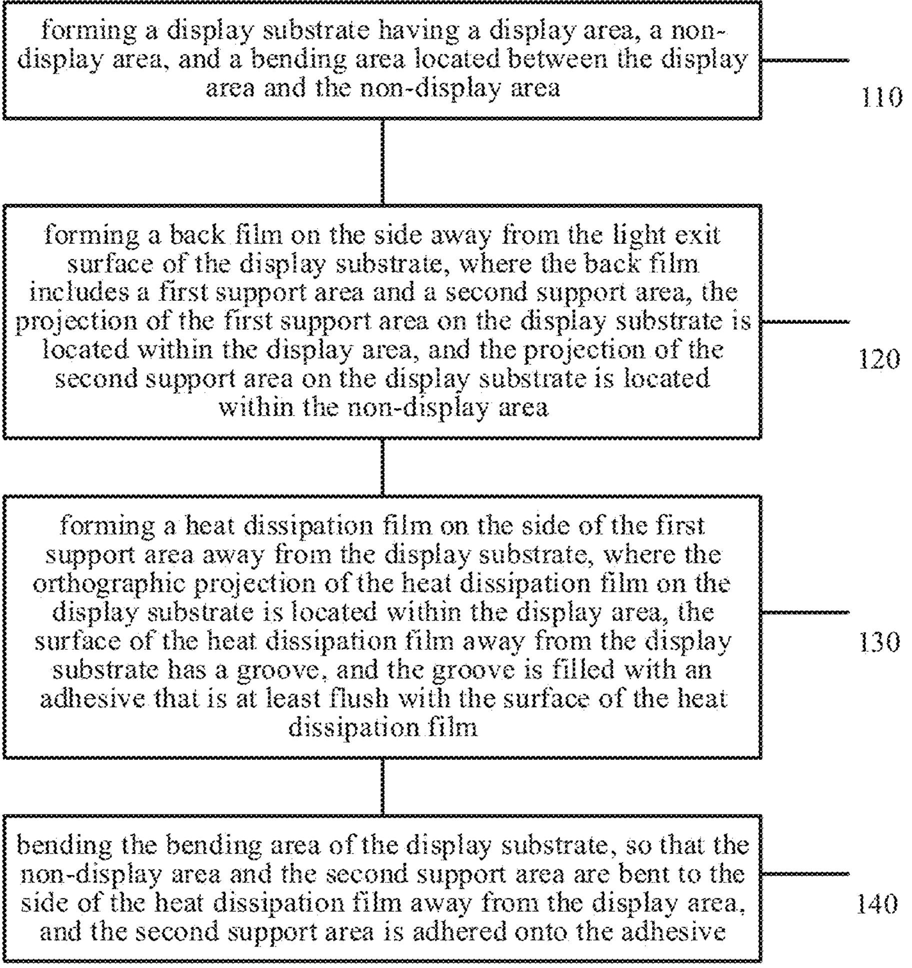
FIG. 10 is a schematic flowchart of a method for manufacturing a display panel according to an embodiment of the present disclosure.

In an embodiment of the present disclosure, a method for manufacturing a display panel is further provided, which method is used to manufacture the display panel shown in the above embodiments. As shown in FIG. 10, the method includes the following steps.

Step 110: forming a display substrate having a display area, a non-display area, and a bendable area located between the display area and the non-display area.

Step 120: forming a back film on the side away from the light exit surface of the display substrate. The back film includes a first support area and a second support area. The projection of the first support area on the display substrate at least overlaps with the display area. The projection of the second support area on the display substrate is located within the non-display area.

Step 130: forming a heat dissipation film on the side of the first support area away from the display substrate. The orthographic projection of the heat dissipation film on the back film is located within the first support area. The surface of the heat dissipation film away from the display substrate has a groove, and the groove is filled with an adhesive that is at least flush with the surface of the heat dissipation film.

Step 140: bending the bendable area of the display substrate, so that the non-display area and the second support area are bent to the side of the heat dissipation film away from the display area, and the second support area is adhered onto the adhesive.

In an embodiment of the present disclosure, the display panel described in the above embodiments can be manufactured through the above steps 110 to 140. The technical effects of the display panel as manufactured can be specifically referred to the above embodiments, which will not be repeated in the embodiments of the present disclosure.

In view of the above embodiments, it can be seen that the production of the heat dissipation film on the side of the back film away from the display substrate may be achieved through a variety of processes. That is, the above step 130 may be implemented through a variety of processes. For example, a heat dissipation film is first formed, and then the entire heat dissipation film is adhered to the side of the back film away from the display substrate. Alternatively, the adhesive layer, the thermally conductive layer, and the conductive layer included in the heat dissipation film are adhered layer by layer to the side of the back film away from the display substrate.

With respect to the process where a heat dissipation film is formed first and then the overall adhering procedure is performed, the implementation details of this process are as follows.

The conductive layer with a first through hole and the thermally conductive layer with a second through hole are formed. The conductive layer is supported on the operation table, leaving a gap with a first distance between the conductive layer and the table top of the operation table, where the first distance is less than or equal to 0.02 mm. The thermally conductive layer is stacked on the conductive layer, so that the second through hole is facing directly the first through hole to form the groove. The adhesive layer is formed on the side of the thermally conductive layer away from the conductive layer to obtain the heat dissipation film, where the adhesive layer extends to the first through hole and the second through hole. The heat dissipation film is peeled off from the table top of the operation table, and the surface of the adhesive layer away from the thermally conductive layer is adhered to the side of the first support area away from the display substrate.

The above implementation details are explained by taking the groove penetrating the conductive layer and the thermally conductive layer of the heat dissipation film as an example. It is noted that blind holes may also be provided on the surface close to the conductive layer, or provided only on the surface of the conductive layer away from the thermally conductive layer, and so on. The embodiments of the present disclosure will not elaborate on the corresponding implementation details. It only needs to be noted that in the case where the groove does not penetrate both the conductive layer and the thermally conductive layer, it is necessary to separately fill the grooves formed by the through holes and/or blind holes with the adhesive that is at least flush with the surface of the conductive layer, after the multiple structural layers of the heat dissipation film are completely adhered.

It should be noted that although various steps of the method for manufacturing a display panel in the present disclosure are described in a specific order in FIG. 10, this does not require or imply that these steps must be performed in this specific order, or that all of these steps must be performed, for the purpose of achieving the desired results. Additionally or alternatively, certain steps may be omitted, multiple steps may be combined into one step for execution, and/or one step may be decomposed into multiple steps for execution, etc.

An embodiment of the present disclosure also provides a display apparatus, which includes the display panel described in the above embodiments. The display panel described in the above embodiments can achieve an extremely narrow frame. Therefore, when a display apparatus is manufactured based on the display panel in the above embodiments, the display apparatus can have an extremely narrow frame, thereby improving the aesthetics of the display apparatus.

Other embodiments of the present disclosure will be readily apparent to those skilled in the art from consideration of the specification and practice of the contents disclosed herein. The present application is intended to cover any variations, uses, or adaptations of the present disclosure that follow the general principle of the present disclosure and include common knowledge or customary technical means in the technical field that are not disclosed in the present disclosure. It is intended that the specification and examples be considered as exemplary only, with the true scope and spirit of the present disclosure being indicated by the following claims.

The invention claimed is:

1. A display panel, comprising:

a display substrate, having a display area, a non-display area, and a bendable area located between the display area and the non-display area;

a back film, located on a side away from a light exit surface of the display substrate, wherein the back film comprises a first support area and a second support area, a projection of the first support area on the display substrate at least overlaps with the display area, and a projection of the second support area on the display substrate is located within the non-display area; and a heat dissipation film, located on a side of the back film away from the display substrate, wherein an orthographic projection of the heat dissipation film on the back film is located within the first support area, a surface of the heat dissipation film away from the display substrate is provided with a groove, and the groove is filled with an adhesive, wherein after the bendable area is bent, the non-display area and the second support area are located on a side of the heat dissipation film away from the first support area, and the second support area covers the groove and is in contact with the adhesive; and an orthographic projection of the groove on the display substrate is located within a portion, not overlapped with the bendable area, of an orthographic projection of the first support area on the display substrate.

2. The display panel according to claim 1, wherein the heat dissipation film comprises an adhesive layer, a thermally conductive layer, and a conductive layer sequentially stacked in a direction away from the display substrate, and the groove penetrates the conductive layer.

3. The display panel according to claim 2, wherein the groove further penetrates the thermally conductive layer, and the adhesive layer extends into the groove to form the adhesive.

4. The display panel according to claim 1, wherein a groove wall of the groove is provided with a step surface facing the display substrate.

5. The display panel according to claim 4, wherein the heat dissipation film comprises an adhesive layer, a thermally conductive layer, and a conductive layer;

a depth of the groove is greater than a thickness of the conductive layer; and an area of a first region corresponding to the groove on a surface of the thermally conductive layer facing the conductive layer is larger than an area of a second region corresponding to the groove on a surface of the conductive layer facing the thermally conductive layer.

6. The display panel according to claim 1, wherein the groove is gradually shrinked in a direction approaching the display substrate.

7. The display panel according to claim 1, wherein a difference between a thickness of the adhesive and a depth of the groove is less than or equal to 0.02 mm.

8. The display panel according to claim 1, wherein a surface of the heat dissipation film away from the display substrate is provided with a plurality of grooves distributed in an array, and each groove is filled with the adhesive.

9. The display panel according to claim 8, wherein in an arrangement direction of the display area, the bendable area, and the non-display area, a distance between the groove at an outermost position and a respective edge on the heat dissipation film is greater than or equal to 0.3 mm; and in a direction perpendicular to the arrangement direction of the display area, the bendable area, and the non-display area, a distance between the groove at an outermost position and a respective edge on the heat dissipation film is greater than or equal to 3.5 mm.

10. A display apparatus, comprising a display panel, wherein the display panel comprises:

a display substrate, having a display area, a non-display area, and a bendable area located between the display area and the non-display area;

a back film, located on a side away from a light exit surface of the display substrate, wherein the back film comprises a first support area and a second support area, a projection of the first support area on the display substrate at least overlaps with the display area, and a projection of the second support area on the display substrate is located within the non-display area; and a heat dissipation film, located on a side of the back film away from the display substrate, wherein an orthographic projection of the heat dissipation film on the back film is located within the first support area, a surface of the heat dissipation film away from the display substrate is provided with a groove, and the groove is filled with an adhesive, wherein after the bendable area is bent, the non-display area and the second support area are located on a side of the heat dissipation film away from the first support area, and the second support area covers the groove and is in contact with the adhesive; and an orthographic projection of the groove on the display substrate is located within a portion, not overlapped with the bendable area, of an orthographic projection of the first support area on the display substrate.

11. The display apparatus according to claim 10, wherein the heat dissipation film comprises an adhesive layer, a thermally conductive layer, and a conductive layer sequentially stacked in a direction away from the display substrate, and the groove penetrates the conductive layer.

12. The display apparatus according to claim 11, wherein the groove further penetrates the thermally conductive layer, and the adhesive layer extends into the groove to form the adhesive.

13. The display apparatus according to claim 10, wherein a groove wall of the groove is provided with a step surface facing the display substrate.

14. The display apparatus according to claim 13, wherein the heat dissipation film comprises an adhesive layer, a thermally conductive layer, and a conductive layer;

a depth of the groove is greater than a thickness of the conductive layer; and an area of a first region corresponding to the groove on a surface of the thermally conductive layer facing the conductive layer is larger than an area of a second region corresponding to the groove on a surface of the conductive layer facing the thermally conductive layer.

15. The display apparatus according to claim 10, wherein the groove is gradually shrinked in a direction approaching the display substrate.

16. The display apparatus according to claim 10, wherein a difference between a thickness of the adhesive and a depth of the groove is less than or equal to 0.02 mm.

17. The display apparatus according to claim 10, wherein a surface of the heat dissipation film away from the display substrate is provided with a plurality of grooves distributed in an array, and each groove is filled with the adhesive.

18. The display apparatus according to claim 17, wherein in an arrangement direction of the display area, the bendable area, and the non-display area, a distance between the groove at an outermost position and a respective edge on the heat dissipation film is greater than or equal to 0.3 mm; and in a direction perpendicular to the arrangement direction of the display area, the bendable area, and the non-display area, a distance between the groove at an outermost position and a respective edge on the heat dissipation film is greater than or equal to 3.5 mm.

* * * * *